(12) United States Patent
Jeong

(10) Patent No.: US 11,799,431 B2
(45) Date of Patent: Oct. 24, 2023

(54) OUTPUT BUFFER AND DATA DRIVER CIRCUIT INCLUDING THE SAME

(71) Applicant: LX SEMICON CO., LTD., Daejeon (KR)

(72) Inventor: Byeong Ho Jeong, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 8 days.

(21) Appl. No.: 17/552,677

(22) Filed: Dec. 16, 2021

(65) Prior Publication Data

US 2022/0200555 A1 Jun. 23, 2022

(30) Foreign Application Priority Data

Dec. 18, 2020 (KR) .......................... 10-2020-0178632

(51) Int. Cl.
*H03F 3/45* (2006.01)
*H03F 3/30* (2006.01)

(52) U.S. Cl.
CPC ..... *H03F 3/45273* (2013.01); *H03F 3/45192* (2013.01)

(58) Field of Classification Search
CPC ............ H03F 3/45273; H03F 3/45192; H03F 3/45219; H03F 3/3028; G09G 3/20; G09G 3/3685; G09G 2300/0828; G09G 2330/021

USPC ................................................. 330/252–261
See application file for complete search history.

(56) References Cited

U.S. PATENT DOCUMENTS 9,543,912 B2 * 1/2017 Lee .......................... H03F 3/301
10,924,074 B2 2/2021 Mallala et al.

FOREIGN PATENT DOCUMENTS

| KR | 10-1579839 B1 | 12/2015 |
| KR | 10-2074230 B1 | 2/2020 |

* cited by examiner

*Primary Examiner* — Hieu P Nguyen
(74) *Attorney, Agent, or Firm* — ROTHWELL, FIGG, ERNST & MANBECK, P.C.

(57) ABSTRACT

This disclosure relates to an output buffer including an input stage configured to monitor a difference between an input voltage and an output voltage, a current summing stage configured to generate amplified currents and control voltages according to the difference between the input voltage and the output voltage monitored by the input stage, an output stage configured to perform a pull-up operation or a pull-down operation according to the control voltages output from the current summing stage to generate the output voltage at an output terminal, and a slew boost circuit configured to perform a slew boost operation of adjusting some currents among currents provided from the current summing stage to the input stage according to the difference between the input voltage and the output voltage by monitoring the difference between the input voltage and the output voltage and selectively perform the slew boost operation by monitoring the control voltages.

19 Claims, 7 Drawing Sheets

350

OUTPUT BUFFER AND DATA DRIVER CIRCUIT INCLUDING THE SAME

CROSS-REFERENCE TO RELATED APPLICATIONS

This application claims the benefit of the Korean Patent Application No. 10-2020-0178632 filed on Dec. 18, 2020, which are hereby incorporated by reference as if fully set forth herein.

FIELD OF THE INVENTION

The present disclosure relates to an output buffer, which is capable of being driven at a high speed and reducing power consumption by increasing a slew rate of an output voltage, and a data driver circuit including the same.

BACKGROUND

A display device includes a panel which displays an image through a pixel matrix, a gate driver circuit which drives gate lines of the panel, a data driver circuit which supplies data signals to data lines of the panel, and a timing controller which controls the gate driver circuit and the data driver circuit.

The data driver circuit includes an output buffer for preventing the data signal supplied to the data line from being distorted by a load component. Circuits other than the data driver circuit may also include an output buffer to prevent distortion of an output signal.

As display devices are progressing in a high-speed driving direction, an output buffer requires a high-speed driving method of increasing a slew rate of an output voltage and also requires a method of reducing power consumption.

SUMMARY

The present disclosure is directed to providing an output buffer, which is capable of being driven at a high speed and reducing power consumption by increasing a slew rate of an output voltage, and a data driver circuit including the same.

An output buffer according to an aspect of the present disclosure includes an input stage configured to monitor a difference between an input voltage and an output voltage, a current summing stage configured to generate amplified currents and control voltages according to the difference between the input voltage and the output voltage monitored by the input stage, an output stage configured to perform a pull-up operation or a pull-down operation according to the control voltages output from the current summing stage to generate the output voltage at an output terminal, and a slew boost circuit configured to perform a slew boost operation of adjusting some currents among currents provided from the current summing stage to the input stage according to the difference between the input voltage and the output voltage by monitoring the difference between the input voltage and the output voltage and selectively perform the slew boost operation by monitoring the control voltages.

The current summing stage may include a first current path connected to the input stage and a second current path connected to the input stage and the output stage and connected to the first current path in a current mirror structure, and the slew boost circuit may be connected to the first current path of the current summing stage through the input stage.

When the input voltage and the output voltage are different by a predetermined voltage or more, the slew boost circuit may adjust a sink current and a source current provided to the input stage from the first current path of the current summing stage to adjust currents and the control voltages provided to the output stage from the second current path of the current summing stage.

When the input voltage and the output voltage are different by a predetermined voltage or more, the slew boost circuit may additionally increase any one sink current that is increased according to the difference between the input voltage and the output voltage among the currents provided to the input stage from the current summing stage or additionally increase any one source current that is increased according to the difference between the input voltage and the output voltage thereamong to adjust the currents and the control voltages provided to the output stage from the current summing stage.

The input stage may include a first input portion including p-channel metal-oxide semiconductor (PMOS) transistors each controlled by the input voltage and the output voltage, a second input portion including n-channel metal-oxide semiconductor (NMOS) transistors each controlled by the input voltage and the output voltage, a first bias circuit including a PMOS transistor controlled by a first bias voltage to provide a bias current to the first input portion, and a second bias circuit including an NMOS transistor controlled by a second bias voltage to provide a bias current to the second input portion.

The current summing stage may include a first current mirror including PMOS transistors connected to a supply line of a first power line in a current mirror structure, a first cascode circuit including PMOS transistors connected to the first current mirror in series and controlled by a third bias voltage, a second current mirror including NMOS transistors connected to a supply line of a second power source in a current mirror structure, a second cascode circuit including NMOS transistors connected to the second current mirror in series and controlled by a fourth bias voltage, a third bias circuit including a PMOS transistor and an NMOS transistor connected to a first current path between the first cascode circuit and the second cascode circuit and respectively controlled by a fifth bias voltage and a sixth bias voltage, and a fourth bias circuit including a PMOS transistor and an NMOS transistor connected to a second current path between the first cascode circuit and the second cascode circuit and respectively controlled by a seventh bias voltage and an eighth bias voltage.

The output stage may include a pull-up PMOS transistor controlled by a first control voltage generated in a first output node between the first cascode circuit and the fourth bias circuit and connected between the supply line of the first power source and the output terminal, and a pull-down NMOS transistor controlled by a second control voltage generated in a second output node between the second cascode circuit and the fourth bias circuit and connected between the output terminal and the supply line of the second power source.

The output stage may further include a capacitor portion including a first capacitor connected between the output terminal and a third output node between the first current mirror and the first cascode circuit, and a second capacitor connected between the output terminal and a fourth output node between the second current mirror and the second cascode circuit.

The slew boost circuit may further include a first current control portion configured to control any one source current generated in the current summing stage according to the difference between the input voltage and the output voltage, and a first switching portion including a PMOS transistor controlled by the first control voltage and connected between the supply line of the first power source and the first current control portion.

The slew boost circuit may further include a second current control portion configured to control any one sink current generated in the current summing stage according to the difference between the input voltage and the output voltage, and a second switching portion including an NMOS transistor controlled by the second control voltage and connected between the second current control portion and the supply line of the second power source.

When the first control voltage is a gate-on voltage, the first switching portion may provide a bias current to the first current control portion, and when the first control voltage is a gate-off voltage, the first switching portion may block a current flow of the first current control portion.

When the second control voltage is a gate-on voltage, the second switching portion may provide a bias current to the second current control portion, and when the second control voltage is a gate-off voltage, the second switching portion may block a current flow of the second current control portion.

The first current control portion may include a third input portion including PMOS transistors each controlled by the input voltage and the output voltage, a fifth bias circuit controlled by the first bias voltage and connected between the supply line of the first power source and the PMOS transistor of the first switching portion, and an NMOS transistor connected between the PMOS transistor controlled by the input voltage in the third input portion and the supply line of the second power source in a diode structure, wherein the PMOS transistor controlled by the output voltage in the third input portion is connected to the first current path of the current summing stage.

The second current control portion may include a fourth input portion including NMOS transistors each controlled by the input voltage and the output voltage, a sixth bias circuit controlled by the second bias voltage and connected between the NMOS transistor of the second switching portion and the supply line of the second power source, and an PMOS transistor connected between the supply line of the first power source and the NMOS transistor, which is controlled by the input voltage in the fourth input portion, in a diode structure, wherein the NMOS transistor controlled by the output voltage in the fourth input portion is connected to the first current path of the current summing stage.

In the slew boost circuit, when a difference between the input voltage and the output voltage is a predetermined voltage or higher and the first control voltage is a gate-on voltage, an output current of the PMOS transistor controlled by the output voltage in the third input portion may be added to an output current of the PMOS transistor controlled by the output voltage in the first input portion to increase a source current flowing from the slew boost circuit and the input stage to the first current path of the current summing stage.

In the slew boost circuit, when a difference between the input voltage and the output voltage is a predetermined voltage or higher and the second control voltage is a gate-on voltage, an input current of the NMOS transistor controlled by the output voltage in the fourth input portion may be added to an input current of the NMOS transistor controlled by the output voltage in the second input portion to increase a sink current flowing from the first current path of the current summing stage to the input stage and the slew boost circuit.

When the first control voltage is a gate-on voltage, the PMOS transistor of the first switching portion may be turned on to provide a bias current of the fifth bias circuit to the PMOS transistors of the first current control portion, and when the first control voltage is a gate-off voltage, the PMOS transistor of the first switching portion may be turned off to block a current flow of the first current control portion.

When the second control voltage is a gate-on voltage, the NMOS transistor of the second switching portion may be turned on to provide a bias current of the sixth bias circuit to the NMOS transistors of the second current control portion, and when the second control voltage is a gate-off voltage, the NMOS transistor of the second switching portion may be turned off to block a current flow of the second current control portion.

When any one of the first control voltage and the second control voltage is a gate-on voltage, the slew boost circuit may perform the slew boost operation, and when both the first control voltage and the second control voltage are a gate-off voltage, the slew boost operation may be turned off.

When the input voltage and the output voltage are different by a predetermined voltage or more and any one of the control voltages is a gate-on voltage, the slew boost circuit may perform the slew boost operation, and when the input voltage and the output voltage are equal and the control voltages are a gate-off voltage, the slew boost operation may be turned off.

A data driver circuit according to one aspect includes a digital-analog converter configured to convert input digital data into an analog data signal to output the analog data signal, and an output buffer portion including the output buffer for each channel so as to buffer an input data signal provided from the digital-analog converter and output an output data signal to an output channel.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
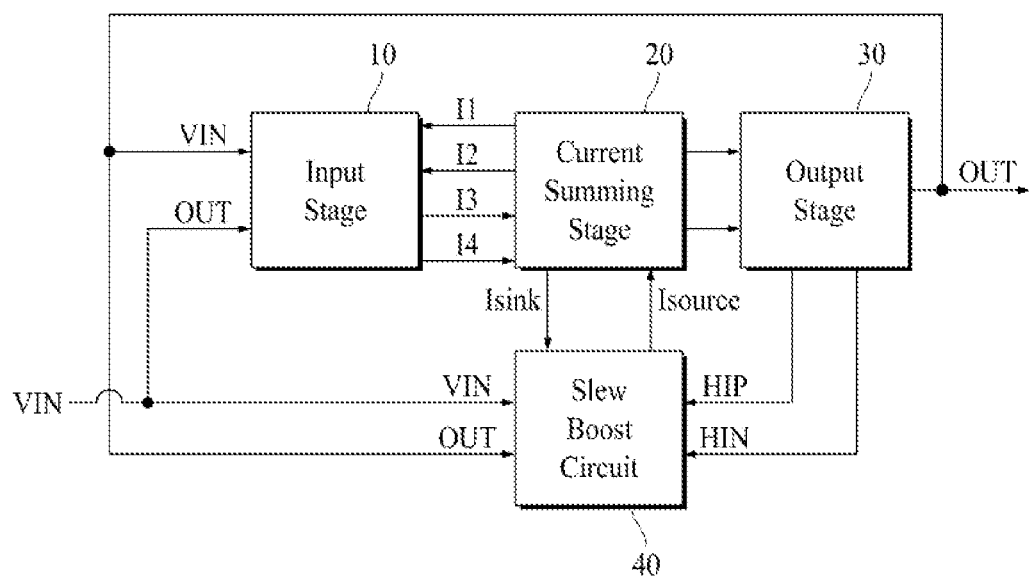
FIG. 1 is a block diagram illustrating a configuration of an output buffer according to one embodiment.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described with reference to the accompanying drawings.

FIG. 1 is a block diagram illustrating a configuration of an output buffer according to one embodiment.

Referring to FIG. 1, an output buffer BF according to one embodiment includes an input stage 10, a current summing stage 20, an output stage 30, and a slew boost circuit 40.

The output buffer BF includes an operational amplifier having a voltage follower structure which includes the input stage 10, the current summing stage 20, and the output stage 30. The operational amplifier may differentially amplify a difference between an input voltage VIN and an output voltage OUT to generate the output voltage OUT that rapidly follows the input voltage VIN.

The input stage 10 may monitor a difference between the input voltage VIN input to a non-inverting terminal and the output voltage OUT fed back and input to an inverting terminal to adjust control currents I1 to I4 provided from the current summing stage 20.

The current summing stage 20 may amplify currents according to the difference between the input voltage VIN and the output voltage OUT together with the input stage 10 to generate the control currents I1 to I4 provided to the input stage 10 and may generate output currents and control voltages HIP and HIN adjusted according to the control currents I1 to I4 to provide the output currents and the control voltages HIP and HIN to the output stage 30.

Among the control currents I1 to I4 generated in the current summing stage 20, the currents I1 and I2 flowing from the current summing stage 20 to the input stage 10 are sink currents, and the control currents I3 and I4 flowing from the input stage 10 to the current summing stage 20 are source currents.

The output stage 30 may perform a pull-up operation and a pull-down operation according to the control voltages HIP and HIN provided from the current summing stage 20 to output the output voltage OUT following the input voltage VIN through an output terminal.

The slew boost circuit 40 may operate to monitor the input voltage VIN and the output voltage OUT as well as monitor the control voltages HIP and HIN of the output stage 30. When the difference between the input voltage VIN and the output voltage OUT is a predetermined voltage or higher and the control voltages HIP and HIN of the output stage 30 become a gate-on voltage, the slew boost circuit 40 may operate to additionally adjust and increase a sink current $I_{sink}$ or a source current $I_{source}$ generated in the current summing stage 20 to indirectly adjust an output current of the current summing stage 20, thereby increasing a slew rate of the output voltage OUT.

In addition, when both the control voltages HIP and HIN of the output stage 30 are a gate-off voltage, that is, when the input voltage VIN and the output voltage OUT are equal, since the operation of the slew boost circuit 40 is turned off to block a flow of an unnecessary current, power consumption can be reduced.

Figure 2:
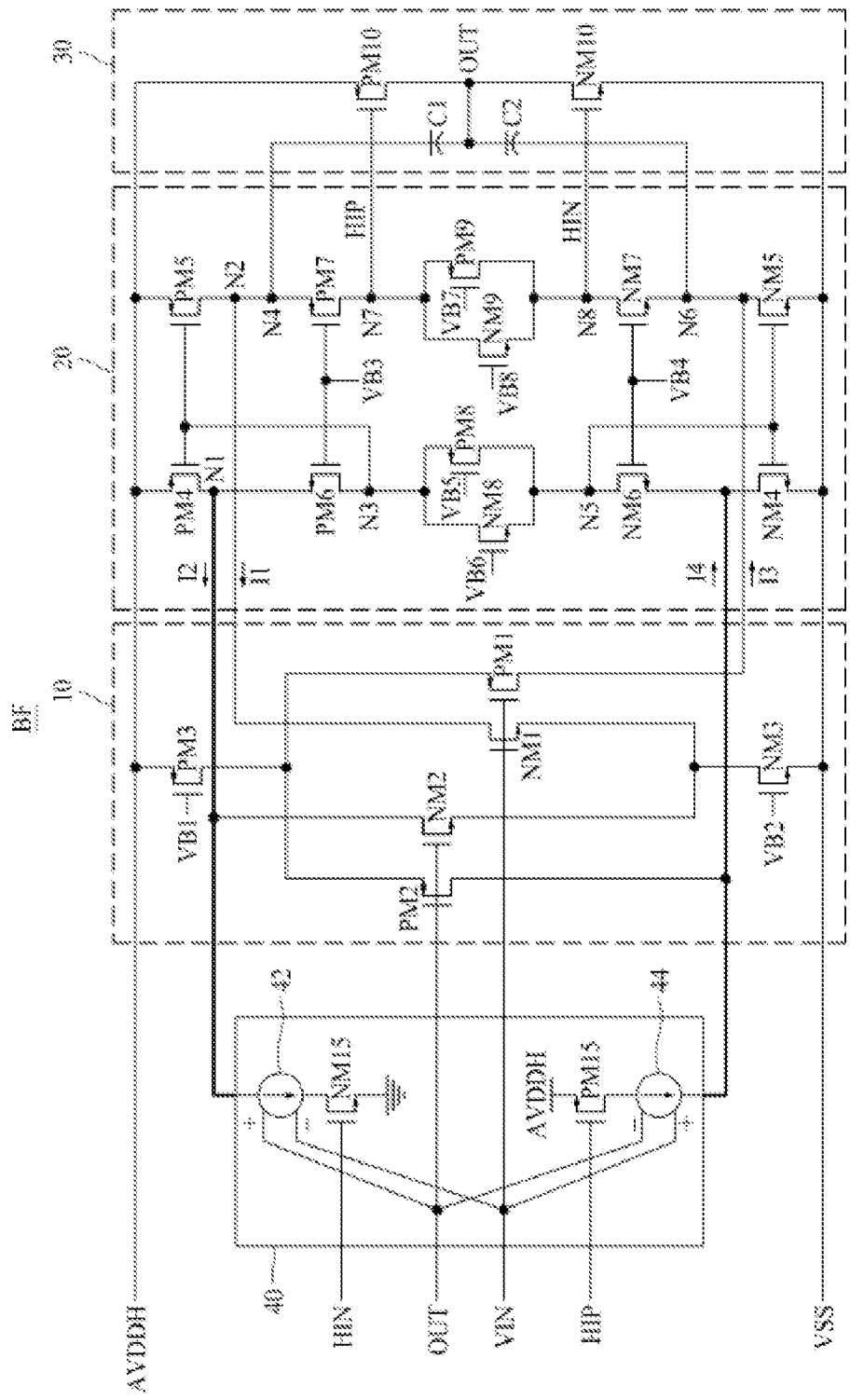
FIG. 2 is an equivalent circuit diagram illustrating a configuration of an output buffer according to one embodiment.
Figure 3:
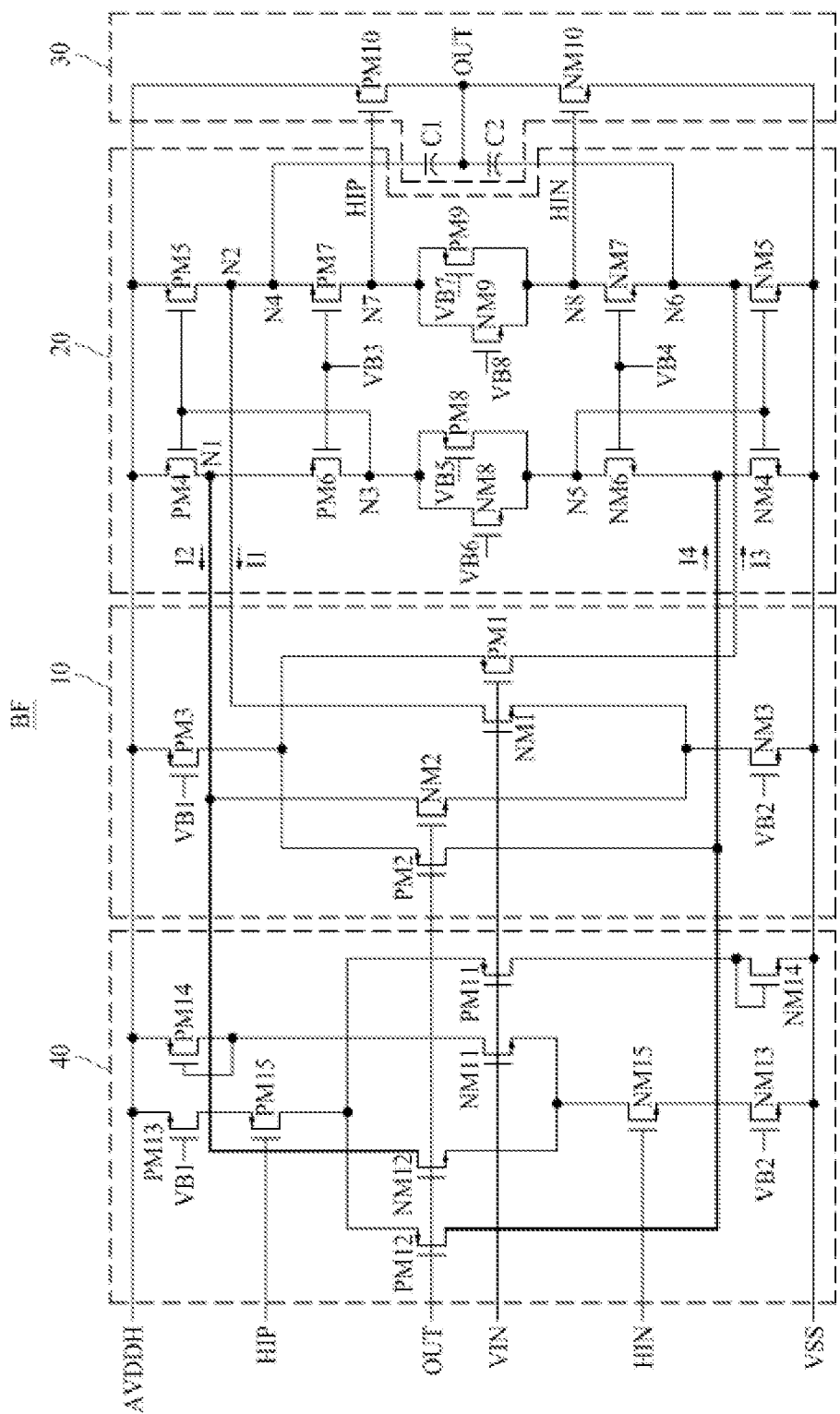
FIG. 3 is an equivalent circuit diagram illustrating a configuration of an output buffer according to one embodiment.
Figure 4:
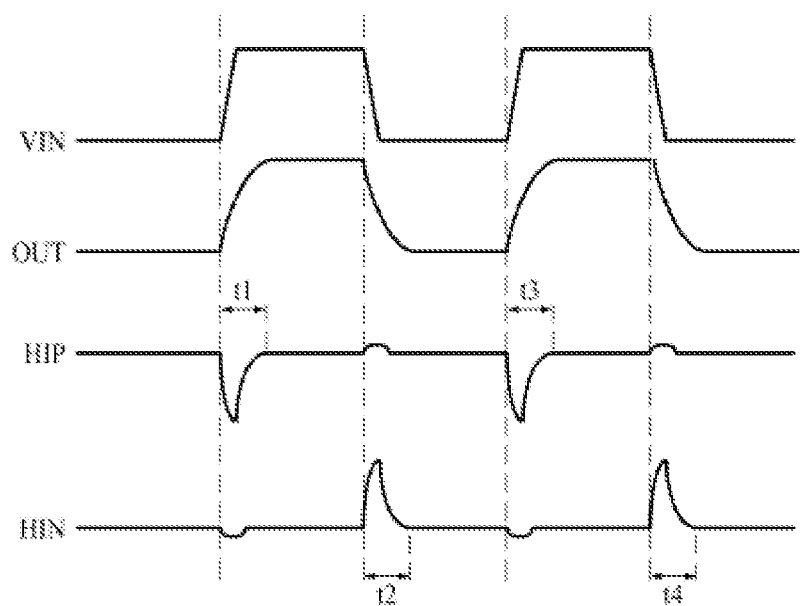
FIG. 4 is a driving waveform diagram of an output buffer according to one embodiment.

FIGS. 2 and 3 each are an equivalent circuit diagram illustrating a configuration of an output buffer according to one embodiment, and FIG. 4 is a driving waveform diagram of an output buffer according to one embodiment.

Referring to FIGS. 2 and 3, an output buffer BF includes an input stage 10, a current summing stage 20, an output stage 30, and a slew boost circuit 40. FIG. 3 illustrates a specific configuration of the slew boost circuit 40 according to one embodiment in comparison with FIG. 2.

The input stage 10 may include a first input portion including p-channel metal-oxide semiconductor (PMOS) transistors PM1 and PM2, a second input portion including n-channel metal-oxide semiconductor (NMOS) transistors NM1 and NM2, a first bias circuit including a PMOS transistor PM3, and a second bias circuit including an NMOS transistor NM3.

The PMOS transistors PM1 and PM2 of the first input portion may be respectively controlled by an input voltage VIN and an output voltage OUT and may adjust source currents I3 and I4 provided by the current summing stage 20 according to the input voltage VIN and the output voltage OUT.

The NMOS transistors NM1 and NM2 of the second input portion may be respectively controlled by the input voltage VIN and the output voltage OUT and may adjust sink currents I1 and I2 provided by the current summing stage 20 according to the input voltage VIN and the output voltage OUT.

The PMOS transistor PM3 of the first bias circuit may be connected between a supply line of a first power source (high potential power source) AVDDH and the first input portion and may be controlled by a bias voltage VB1 to provide a bias current to the PMOS transistors PM1 and PM2 of the first input portion.

The NMOS transistor NM3 of the second bias circuit may be connected between the second input portion and a supply line of a second power source (low potential power source) VSS and may be controlled by a second bias voltage VB2 to provide a bias current to the NMOS transistors NM1 and NM2 of the second input portion.

The current summing stage 20 may include a first current mirror including PMOS transistors PM4 and PM5, a first cascode circuit including PMOS transistors PM6 and PM7, a second current mirror including NMOS transistors NM4 and NM5, a second cascode circuit including NMOS transistors NM6 and NM7, a third bias circuit including PMOS and NMOS transistors PM8 and NM8, and a fourth bias circuit including PMOS and NMOS transistors PM9 and NM9. Each of the third and fourth bias circuits may be defined as floating bias circuits.

The PMOS transistors PM4 and PM5 of the first current mirror are connected to the NMOS transistors NM1 and NM2 of the second input portion of the input stage 10 and are connected in the form of a current mirror between the supply line of the first power source AVDDH and the first cascode circuit. Gate electrodes of the PMOS transistors PM4 and PM5 of the first current mirror are connected to an output node N3 of the first cascode circuit. The PMOS transistors PM4 and PM5 of the first current mirror provide the sink currents I1 and I2 to the NMOS transistors NM1 and NM2 of the second input portion through output nodes N2 and N1, provide an output current through the first cascode circuit, and provide an output current to a capacitor C1 of the output stage 30 through an output node N4.

The PMOS transistors PM6 and PM7 of the first cascode circuit may be connected between the first current mirror and the third and fourth bias circuits and may be controlled by a third bias voltage VB3 to provide a first control voltage HIP to the output stage 30 through an output node N7.

The fourth and fifth NMOS transistors NM4 and NM5 of the second current mirror are connected to the PMOS transistors PM1 and PM2 of the first input portion of the input stage 10 and are connected in the form of a current mirror between the second cascode circuit and the supply line of the second power source VSS. Gate electrodes of the NMOS transistors NM4 and NM5 of the second current mirror are connected to an output node N5 of the second cascode circuit. The NMOS transistors NM4 and NM5 of the second current mirror may provide the source currents I3 and I4 to the PMOS transistors PM1 and PM2 of the first input portion through output nodes, provide an output current through the second cascode circuit, and provide an output current to a capacitor C2 of the output stage 30 through an output node N6.

The NMOS transistors NM6 and NM7 of the second cascode circuit may be connected between the third and fourth bias circuits and the second current mirror and may be controlled by a fourth bias voltage VB4 to provide a second control voltage HIN to the output stage 30 through an output node N8.

The PMOS transistor PM8 and the NMOS transistor NM8 of the third bias circuit may be connected between the PMOS transistor PM6 of the first cascode circuit and the NMOS transistor NM6 of the second cascode circuit and may be respectively controlled by fifth and sixth bias voltages VB5 and VB6 to provide a bias current flowing from the output node N3 of the first cascode circuit to the output node N5 of the second cascode circuit.

The PMOS transistor PM9 and the NMOS transistor NM9 of the fourth bias circuit may be connected between the PMOS transistor PM7 of the first cascode circuit and the NMOS transistor NM7 of the second cascode circuit and may be respectively controlled by seventh and eighth bias voltages VB7 and VB8 to provide a bias current flowing from the output node N7 of the first cascode circuit to the output node N8 of the second cascode circuit.

The output stage 30 may include a pull-up PMOS transistor PM10, a pull-down NMOS transistor NM10, and a capacitor portion including the capacitors C1 and C2.

The pull-up PMOS transistor PM10 is controlled by the first control voltage HIP provided from the first output node N7 of the current summing stage 20 and is connected between the supply line of the first power source AVDDH and an output terminal. The pull-up PMOS transistor PM10 may perform a pull-up operation under control of the first control voltage HIP to increase the output voltage OUT. For example, as shown in FIG. 4, when the input voltage VIN is increased to be greater than the output voltage OUT, the first control voltage HIP is decreased and applied as a gate-on voltage, and during a period t1 or t3, the pull-up PMOS transistor PM10 may perform a pull-up operation to increase the output voltage OUT.

The pull-down NMOS transistor NM10 is controlled by the second control voltage HIN provided from a second output node N8 of the current summing stage 20 and is connected between the output terminal and the supply line of the second power source VSS. The pull-down NMOS transistor NM10 may perform a pull-down operation under control of the second control voltage HIN to decrease the output voltage OUT. For example, as shown in FIG. 4, when the input voltage VIN is decreased to be less than the output voltage OUT, the second control voltage HIN is increased and applied as a gate-on voltage, and during a period t2 or t4, the pull-down NMOS transistor NM10 may perform a pull-down operation to decrease the output voltage OUT.

The capacitor portion may include the first capacitor C1 connected between a third output node N4 of the current summing stage 20 and the output terminal, and the second capacitor C2 connected between a fourth output node N6 of the current summing stage 20 and the output terminal. The capacitor portion may stabilize the output voltage OUT such that the output voltage OUT does not oscillate when the output voltage OUT is being increased or decreased.

The current summing stage 20 may provide an output current to the first capacitor C1 through the third output node N4 connected to the first current mirror and provide an output current to the second capacitor C2 through the fourth output node N6 connected to the second current mirror.

The slew boost circuit 40 may include a first current control portion 44 which controls the source current I4 provided from the current summing stage 20 together with the input stage 10 according to a difference between the input voltage VIN and the output voltage OUT, and a first switching portion which includes a PMOS transistor PM15 connected between the supply line of the first power source AVDDH and the first current control portion 44 and controlled by the first control voltage HIP for controlling the output stage 30.

In addition, the slew boost circuit 40 may include a second current control portion 42 which controls the sink current I2 provided from the current summing stage 20 together with the input stage 10 according to the difference between the input voltage VIN and the output voltage OUT, and a second switching portion which includes an NMOS transistor NM15 connected between the second current control portion 42 and the supply line of the second power source VSS and controlled by the second control voltage HIN for controlling the output stage 30.

Referring to FIG. 3, the first current control portion 44 may include a third input portion including PMOS transistors PM11 and PM12 and a fifth bias circuit including a PMOS transistor PM13.

The PMOS transistor PM15 of the first switching portion may be connected between the PMOS transistor PM13 of the fifth bias circuit and the PMOS transistors PM11 and PM12 of the third input portion.

The PMOS transistor PM13 of the fifth bias circuit may be controlled by a first bias voltage VB1 to provide a bias current to the PMOS transistors PM11 and PM12 of the third input portion through the PMOS transistor PM15 of the first switching portion.

When the first control voltage HIP is decreased to a gate-on voltage (a period t1 or t3 of FIG. 4), that is, when the input voltage VIN is greater than the output voltage OUT, the PMOS transistor PM15 of the first switching portion may be turned on to provide a bias current of the fifth bias circuit to the third input portion. On the contrary, when the first control voltage HIP is a gate-off voltage, that is, when the input voltage VIN and the output voltage OUT are equal, the PMOS transistor PM15 of the first switching portion may be turned off to block a flow of an unnecessary current (DC).

The PMOS transistor PM12 controlled by the output voltage OUT in the third input portion of the slew boost circuit 40 may adjust the source current I4 provided from the current summing stage 20. In other words, when the output voltage OUT is decreased according to the input voltage VIN, the PMOS transistor PM12 controlled by the output voltage OUT in the slew boost circuit 40 may increase the source current I4 flowing to the current summing stage 20 together with the PMOS transistor PM2 controlled by the output voltage OUT in the input stage 10.

The PMOS transistor PM11 controlled by the input voltage VIN in the third input portion may be connected to the supply line of the second power source VSS through an NMOS transistor NM14 having a diode structure in which a gate electrode and a drain electrode are connected.

The second current control portion 42 may include a fourth input portion including NMOS transistors NM11 and NM12 and a sixth bias circuit including an NMOS transistor NM13. The NMOS transistor NM15 of the second switching portion may be connected between the NMOS transistors NM11 and NM12 of the fourth input portion and the NMOS transistor NM13 of the sixth bias circuit.

The NMOS transistor NM13 of the sixth bias circuit may be controlled by the second bias voltage VB2 to provide a bias current to the NMOS transistors NM11 and NM12 of the fourth input portion through the NMOS transistor NM15 of the second switching portion.

When the second control voltage HIN provided from the current summing stage 20 to the output stage 30 is increased to a gate-on voltage as shown in FIG. 4 (a period t2 or t4 of FIG. 4), that is, when the input voltage VIN is less than the output voltage OUT, the NMOS transistor NM15 of the second switching portion may be turned on to provide a bias current of the sixth bias circuit to the fourth input portion. On the contrary, when the second control voltage HIN is decreased to a gate-off voltage, that is, when the input voltage VIN and the output voltage OUT are equal, the NMOS transistor NM15 of the second switching portion may be turned off to block a flow of an unnecessary current (DC).

The NMOS transistor NM12 controlled by the output voltage OUT in the fourth input portion of the slew boost circuit 40 may adjust the sink current I2 provided from the current summing stage 20 through the input stage 10. In other words, when the output voltage OUT is increased according to the input voltage VIN, the NMOS transistor NM12 controlled by the output voltage OUT in the fourth input portion of the slew boost circuit 40 may increase the sink current I2 provided from the current summing stage 20 together with the NMOS transistor NM2 controlled by the output voltage OUT in the second input portion of the input stage 10.

The NMOS transistor NM11 to which the input voltage VIN is supplied in the fourth input portion may be connected to the supply line of the first power source AVDDH through a PMOS transistor PM14 having a diode structure in which a gate electrode and a drain electrode are connected.

Between the supply line of the first power source AVDDH and the supply line of the second power source VSS, the current summing stage 20 may include a first current path which passes through the PMOS transistor PM4 of the first current mirror, the PMOS transistor PM6 of the first cascode circuit, the NMOS transistor NM8 and the PMOS transistor PM8 of the third bias circuit, the NMOS transistor NM6 of the second cascode circuit, and the NMOS transistor NM4 of the second current mirror and a second current path which passes through the PMOS transistor PM5 of the first current mirror, the PMOS transistor PM7 of the first cascode circuit, the NMOS transistor NM9 and the PMOS transistor PM9 of the fourth bias circuit, the NMOS transistor NM7 of the second cascode circuit, and the NMOS transistor NM5 of the second current mirror. The first current path may be defined as a current mirroring path, and the second current path may be defined as a current mirrored path.

The slew boost circuit 40 may adjust and increase the sink current I2 and the source current I4, which are generated in the first current path that is the current mirroring path among the current paths of the current summing stage 20, together with the input stage 10 to indirectly control output currents and the control voltages HIP and HIN generated in the second current path that is the current mirrored path, thereby performing a slew boost operation of increasing a slew rate of the output voltage OUT.

An operation of the output buffer BF according to one embodiment will be described with reference to FIGS. 2 to 4.

As shown in FIG. 4, when the input voltage VIN is increased to be greater than the output voltage OUT, a first source current I3 flowing from the input stage 10 to the current summing stage 20 through the PMOS transistor PM1 of the first input portion is decreased, but a second source current I4 flowing to the current summing stage 20 through the PMOS transistor PM2 of the first input portion is increased. In addition, a first sink current I1 provided from the current summing stage 20 to flow through the NMOS transistor NM1 of the second input portion is increased, but a second sink current I2 flowing through the NMOS transistor NM2 of the second input portion is decreased.

Accordingly, an output current flowing through the output node N4 of the first current mirror of the current summing stage 20 is decreased, but an output current flowing through the output node N3 of the first cascode circuit is increased. In addition, an output current flowing through the output node N6 of the second current mirror is decreased, and an output current flowing through the output node N5 of the second cascode circuit is increased.

As a result, the first control voltage HIP provided through the output node N7 of the current summing stage 20 is decreased to a gate-on voltage, and while the first control voltage HIP is decreased to the gate-on voltage and applied (a period t1 or t3), the PMOS transistor PM10 of the output stage 30 may perform a pull-up operation to increase the output voltage OUT. In this case, since the second control voltage HIN is applied as a gate-off voltage through the output node N8 of the current summing stage 20, the NMOS transistor NM10 of the output stage 30 is turned off.

In particular, while the input voltage VIN is greater than the output voltage OUT and the first control voltage HIP is decreased to the gate-on voltage and applied (a period t1 or t3), in the slew boost circuit 40, the PMOS transistor PM15 is turned on, and an output current of the PMOS transistor PM12 of the third input portion is increased. Since the increased output current of the PMOS transistor PM12 in the slew boost circuit 40 is added to an output current of the PMOS transistor PM2 of the input stage 10, the second source current I4 flowing to the current summing stage 20 may be further increased. Voltages of the output nodes N6 and N8 in the current summing stage 20 may be further reduced due to indirect control of the second source current I4 further increased by a boost operation of the slew boost circuit 40.

Accordingly, the capacitor portion including the capacitors C1 and C2 is rapidly discharged, and the second control voltage HIN is further decreased from a gate-off voltage to strongly turn the NMOS transistor NM10 off and block a leakage current, thereby shortening a rise time of the output voltage OUT through the PMOS transistor PM10 to increase a slew rate of the output voltage OUT.

Meanwhile, since the second control voltage HIN applied to the slew boost circuit 40 is a gate-off voltage, the NMOS transistor NM15 may be turned off so that the second current control portion 42 may be turned off.

When the output voltage OUT is rapidly increased and is equal to the input voltage VIN, both the first and second control voltages HIP and HIN may become a gate-off voltage so that the output stage 30 and the slew boost circuit 40 may be turned off, and the output buffer BF may maintain the output voltage OUT that is equal to the input voltage VIN.

As shown in FIG. 4, when the input voltage VIN is decreased to be less than the output voltage OUT, the first source current I3 flowing from the input stage 10 to the current summing stage 20 through the PMOS transistor PM1 of the first input portion is increased, but the second source current I4 flowing to the current summing stage 20 through the PMOS transistor PM2 of the first input portion is decreased. In addition, the first sink current I1 provided from the current summing stage 20 to flow through the NMOS transistor NM1 of the second input portion is decreased, but the second sink current I2 flowing through the NMOS transistor NM2 of the second input portion is increased.

Accordingly, an output current flowing through the output node N4 of the first current mirror of the current summing stage 20 is increased, but an output current flowing through the output node N3 of the first cascode circuit is decreased. In addition, an output current flowing through the output node N6 of the second current mirror is increased, and an output current flowing through the output node N5 of the second cascode circuit is decreased.

As a result, the second control voltage HIN provided through the output node N8 of the current summing stage 20 is increased to a gate-on voltage, and while the second control voltage HIN is increased to the gate-on voltage and applied (a period t2 or t4), the NMOS transistor NM10 of the output stage 30 may perform a pull-down operation to decrease the output voltage OUT.

In this case, the first control voltage HIP provided through the output node N7 of the current summing stage 20 is applied as a gate-off voltage so that the PMOS transistor PM10 of the output stage 30 is turned off.

In particular, while the input voltage VIN is less than the output voltage OUT and the second control voltage HIN is increased to a gate-on voltage and applied (a period t2 or t4), in the slew boost circuit 40, the NMOS transistor NM15 is turned on, and a drain current (input current) of the NMOS transistor NM12 is increased. Since the increased drain current (input current) of the NMOS transistor NM12 in the slew boost circuit 40 is added to a drain current of the NMOS transistor NM2 of the input stage 10, the second sink current I2 provided from the current summing stage 20 may be further increased. Voltages of the output nodes N4 and N7 in the current summing stage 20 may be further increased due to indirect control of the second sink current I2 further increased by a boost operation of the slew boost circuit 40.

Accordingly, the capacitor portion including the capacitors C1 and C2 is rapidly charged, and the first control voltage HIP is further increased from a gate-off voltage to strongly turn the PMOS transistor PM10 off and block a leakage current, thereby shortening a fall time of the output voltage OUT through the NMOS transistor NM10 to increase a slew rate of the output voltage OUT.

Meanwhile, since the first control voltage HIP applied to the slew boost circuit 40 is a gate-off voltage, the PMOS transistor PM15 may be turned off so that the first current control portion 44 may be turned off.

When the output voltage OUT is rapidly decreased and is equal to the input voltage VIN, both the first and second control voltages HIP and HIN may become a gate-off voltage so that the output stage 30 and the slew boost circuit 40 may be turned off, and the output buffer BF may maintain the output voltage OUT that is equal to the input voltage VIN.

Figure 5:
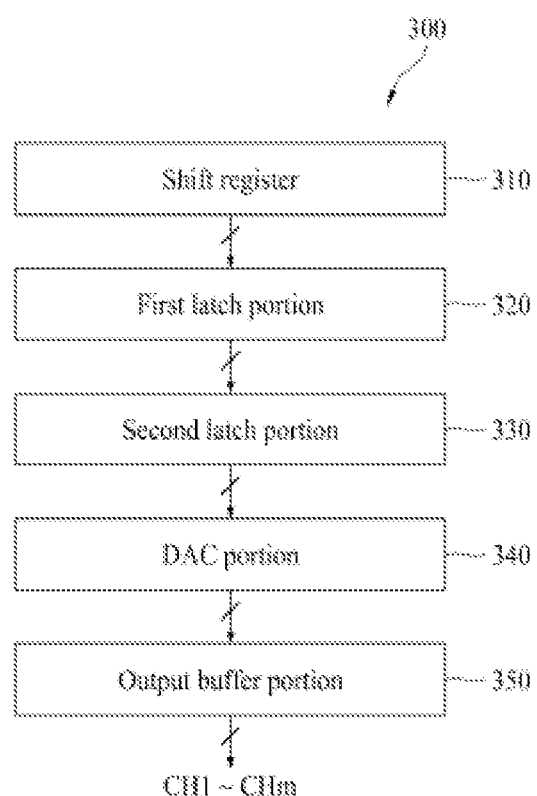
FIG. 5 is a block diagram illustrating a configuration of a data driver circuit according to one embodiment.
Figure 6:
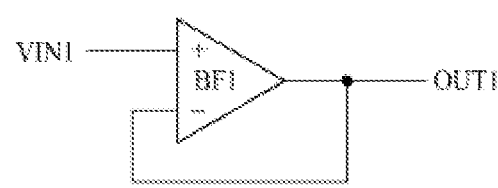
FIG. 6 is an equivalent circuit diagram illustrating a configuration of an output buffer portion of a data driver circuit according to one embodiment.
Figure 6:
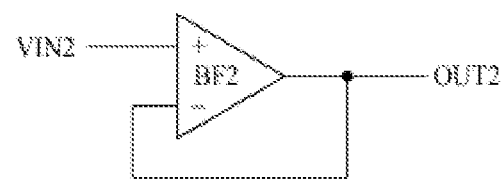
Figure 6:
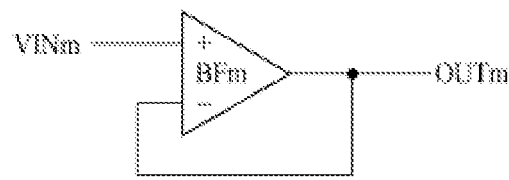

FIG. 5 is a block diagram illustrating a data driver including an output buffer according to one embodiment, and FIG. 6 is an equivalent circuit diagram illustrating an output buffer portion according to one embodiment.

Referring to FIG. 5, a data driver 300 may include a shift register 310, latch portions 320 and 330, a digital-to-analog converter (DAC) portion 340, and an output buffer portion 350.

The shift register 310 may sequentially shift start pulses according to a clock signal to sequentially output a plurality of sampling signals to a first latch portion 320. The shift register 310 may include a plurality of channel stages and may perform a shift operation of sequentially shifting start pulses according to a clock signal, thereby sequentially outputting sampling signals of a plurality of channels to the first latch portion 320. The shift register 310 may include stages of m channels corresponding to the number of output channels CH1 to CHm and may include the number of stages less than m.

In response to the sampling signals of the plurality of channels sequentially input from the shift register 310, the first latch portion 320 may sequentially latch pieces of data of the plurality of channels, which are sequentially input, for each channel of each subpixel portion. When the pieces of data of all the channels are latched, the first latch portion 320 may simultaneously output the pieces of latched data of the channels to a second latch portion 330. The first latch portion 320 may include first latches of m channels corresponding to the number of the output channels CH1 to CHm.

The second latch portion 330 may simultaneously output the pieces of data of the channels (subpixel) provided from the first latch portion 320 to the DAC portion 340 in response to a load signal. The second latch portion 330 may include second latches of m channels corresponding to the number of the output channels CH1 to CHm.

The DAC portion 340 may convert the pieces of data of the subpixels provided from the second latch portion 330 into analog data signals for each channel using gray scale voltages into which reference gamma voltages are subdivided and may output the converted analog data signals to the output buffer portion 350. The DAC portion 340 may include DACs of m channels corresponding to the number of the output channels CH1 to CHm.

The output buffer portion 350 may buffer the data signal of each subpixel provided from the DAC portion 340 for each channel and output the buffered data signal to each of the plurality of output channels CH1 to CHm.

As shown in FIG. 6, the output buffer portion 350 may include output buffers BF1 to BFm of m channels corresponding to the number of the output channels CH1 to CHm.

The output buffers BF1 to BFm shown in FIG. 6 may respectively buffer input data signals VIN1 to VINm provided from the DAC portion 340 to output output data signals OUT1 to OUTm for each channel.

Each output buffer BF may output an output data signal OUT, which rapidly follows an input data signal IN to be equal to the input data signal IN, using current amplification according to a voltage difference between the input data signal IN input to a non-inverting terminal (+) and the output data signal OUT fed back and input to an inverting terminal (−). As described above with reference to FIGS. 1 to 4, each output buffer BF may include an operational amplifier including an input stage 10, a current summing stage 20, and an output stage 30, and a slew boost circuit 40.

When the slew boost circuit 40 monitors the voltage difference between the input data signal IN and the output data signal OUT, and a difference between an input voltage and an output voltage is great, the slew boost circuit 40 may increase a sink current I2 and a source current I4 together with the input stage 10 to improve a slew rate of the output data signal OUT and shorten a rise time and a fall time of the output data signal OUT so that each output buffer BF included in the data driver 300 can be driven at a high speed. In addition, in each output buffer BF included in the data driver 300, the slew boost circuit 40 monitors control voltages HIP and HIN of the output stage 30 together with the difference between the input voltage and the output voltage, and a slew boost operation is turned on or off to block a flow of an unnecessary current (DC), thereby reducing power consumption.

Figure 7:
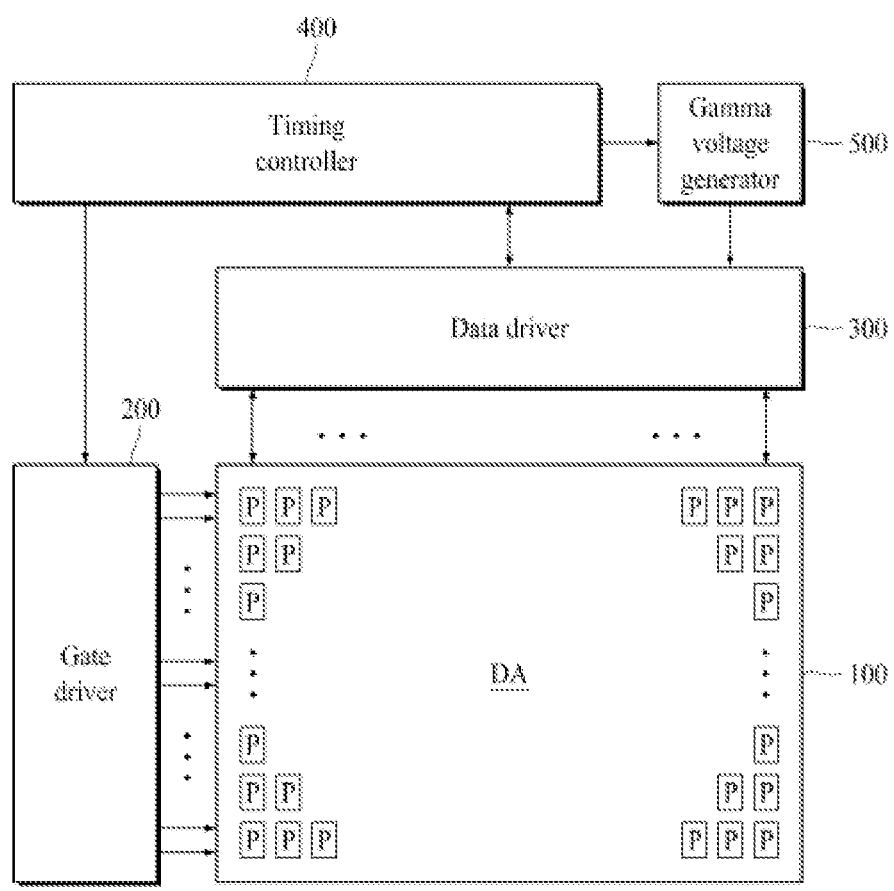
FIG. 7 is a block diagram illustrating a configuration of a display device according to one embodiment.

FIG. 7 is a schematic block diagram illustrating a configuration of a display device including a data driver to which an output buffer is applied according to one embodiment.

The display device according to one embodiment may be any one of various display devices including a liquid crystal display device, an electroluminescent display device, a micro light-emitting diode (LED) display device, and the like. The electroluminescent display device may be an organic light-emitting diode (OLED) display device, a quantum dot light-emitting diode display device, or an inorganic light-emitting diode display device.

Referring to FIG. 7, the display device may include a display panel 100, a gate driver 200, a data driver 300, a gamma voltage generator 500, a timing controller 400, and the like. The gate driver 200 and the data driver 300 may be defined as panel drivers. The gate driver 200, the data driver 300, and the timing controller 400 may be defined as display drivers.

The display panel 100 displays an image through a display area DA in which subpixels P are arranged in a matrix form. Each subpixel P is any one of a red subpixel for emitting red light, a green subpixel for emitting green light, a blue subpixel for emitting blue light, and a white subpixel for emitting white light and is independently driven by at least one thin film transistor (TFT). A unit pixel may include a combination of two, three, or four subpixels having different colors.

A gate electrode of the TFT belonging to each subpixel P is connected to the gate driver 200 through a gate line disposed on the display panel 100, and an input electrode of any one of a source electrode and a drain electrode of each TFT is connected to the data driver 300 through a data line disposed on the display panel 100.

In other words, while the TFT is turned on in response to a scan pulse with a gate-on voltage provided from the gate driver 200 through a corresponding gate line, each subpixel P may receive a data signal, which is provided through a corresponding data line from the data driver 300, through the turned-on TFT, may be charged with a pixel voltage (driving voltage) corresponding to the data signal, and may emit light corresponding to the charged voltage, thereby expressing a gray scale level corresponding to the data signal.

The display panel 100 may further include a touch sensor screen which overlaps the entirety of the display area and senses a user touch, and the touch sensor screen may be embedded in the panel 100 or disposed on the display area of the panel 100.

The timing controller 400 may receive image data and synchronization signals from a host system (not shown). For example, the host system may be any one of a computer, a television (TV) system, a set-top box, a table personnel computer, and a portable terminal system such as a mobile phone. The synchronization signal may include a dot clock, a data enable signal, a vertical synchronization signal, a horizontal synchronization signal, and the like.

By using the received synchronization signals and timing setting information (start timing, pulse width, and the like) stored in an internal register, the timing controller 400 may generate and provide a plurality of data control signals to the data driver 300 and may generate and provide a plurality of gate control signals to the gate driver 200.

The timing controller 400 may perform various image processes, such as luminance correction or image quality correction for reducing power consumption, on the received image data and may supply the processed image data to the data driver 300.

The gamma voltage generator 500 may generate a reference gamma voltage set including a plurality of reference gamma voltages having different voltage levels to provide the generated reference gamma voltage set to the data driver 300. The gamma voltage generator 500 may generate the plurality of reference gamma voltages corresponding to gamma characteristics of the display device under control of the timing controller 400 to provide the generated reference gamma voltages to the data driver 300. The gamma voltage generator 500 may be provided as a programmable gamma integrated circuit (IC), may receive gamma data from the timing controller 400, and may generate or adjust a reference gamma voltage level according to the gamma data to output the generated or adjusted reference gamma voltage level to the data driver 300.

The gate driver 200 may be controlled according to a plurality of gate control signals received from the timing controller 400 to individually drive the gate lines of the display panel 100. The gate driver 200 may sequentially drive the plurality of gate lines. The gate driver 200 may provide a scan signal having a gate-on voltage to a corresponding gate line during a driving period of each gate line and may provide a gate-off voltage to a corresponding gate line during a non-driving period of each gate line.

The gate driver 200 may be provided as at least one gate driving IC and may be mounted on a circuit film such as a tape carrier package (TCP), a chip-on film (COF), a flexible print circuit (FPC), or the like to be attached to the display panel 100 through a tape automatic bonding (TAB) method or may be mounted on the display panel 100 through a chip-on glass (COG) method. Alternatively, the gate driver 200 may be formed on a TFT substrate together with the TFT belonging to each subpixel P of the display panel 100 and embedded in a bezel area of the display panel 100.

The data driver 300 may be controlled according to a data control signal received from the timing controller 400 and may convert a digital image data received from the timing controller 400 into an analog data signal to provide the data signal to each of the data lines of the display panel 100. The data driver 300 may convert the digital image data into the analog data signal using gray scale voltages into which the plurality of reference gamma voltages provided from the gamma voltage generator 500 are subdivided.

The data driver 300 may be provided as at least one data driving IC and may be mounted on a circuit film such as a TCP, a COF, a FPC, or the like and attached to the display panel 100 though a TAB method or may be mounted on the bezel area of the display panel 100 through a COG method.

The data driver 300 may include the output buffer BF according to one embodiment described above with reference to FIGS. 1 to 4. When a difference between an input data signal VIN and an output data signal OUT is great, a slew boost circuit 40 may increase a sink current I2 and a source current I4 together with an input stage 10 to improve a slew rate of the output data signal OUT so that the output buffer BF included in the data driver 300 can be driven at a high speed. In addition, in each output buffer BF included in the data driver 300, the slew boost circuit 40 monitors control voltages HIP and HIN of an output stage 30, and a slew boost operation is turned on or off to block a flow of an unnecessary current (DC), thereby reducing power consumption.

As described above, when a slew boost circuit monitors control voltages of an output stage together with input and output voltages, a difference between the input voltage and the output voltage is a predetermined voltage or higher, and the control voltage of the output stage is changed to be greater than the predetermined voltage, since the slew boost circuit adjusts a sink current and a source current of a current summing stage to indirectly control an output current provided to the output stage, a rise time and a fall time of the output voltage can be shorten to increase a slew rate so that an output buffer according to one embodiment can be driven at a high speed.

In an output buffer according to one embodiment, since a slew boost circuit is turned on or off according to a control voltage of an output stage, when input and output voltages are equal, a flow of an unnecessary current (DC) flow can be blocked to reduce power consumption.

A data driver circuit according to one embodiment includes the above-described output buffer, thereby being driven at a high speed and reducing power consumption.

The output buffer and the data driver circuit of a display device according to the embodiment may be applied to various electronic devices. For example, the output buffer and the data driver circuit of a display device according to the embodiment may be applied to a mobile device, a video phone, a smart watch, a watch phone, a wearable device, a foldable device, a rollable device, a bendable device, a flexible device, a curved device, an electronic notebook, an e-book, a portable multimedia player (PMP), a personal digital assistant (PDA), an MPEG audio layer-3 player, a mobile medical device, a desktop personal computer (PC), a laptop PC, a netbook computer, a workstation, a navigation device, a vehicle navigation device, a vehicle display device, a television, a wallpaper display device, a signage device, a game device, a notebook computer, a monitor, a camera, a camcorder, a home appliance, and the like.

Features, structures, effects, etc. described above in various examples of the present disclosure are included in at least one example of the present disclosure and are not necessarily limited to only one example. Furthermore, features, structures, effects, etc. illustrated in at least one example of the present disclosure may be combined or modified for other examples by those skilled in the art to which the technical idea of the present disclosure pertains. Therefore, the contents related to such combinations and modifications should be interpreted as being included in the technical spirit or scope of the present disclosure.

While the present disclosure described above is not limited to the above-described embodiments and the accompanying drawings, it will be apparent to those skilled in the art to which the present disclosure belongs that various substitutions, modifications, and changes may be made herein without departing from the scope of the present disclosure. Therefore, the scope of the present disclosure is defined by the appended claims, and all changes or modifications derived from the meaning, scope, and equivalence of the claims are to be construed as being included in the scope of the present disclosure.

What is claimed is:

1. An output buffer comprising:
an input stage configured to monitor a difference between an input voltage and an output voltage;
a current summing stage configured to generate amplified currents and control voltages including a first control voltage and a second control voltage according to the difference between the input voltage and the output voltage monitored by the input stage;
an output stage configured to perform a pull-up operation or a pull-down operation according to the control voltages output from the current summing stage to generate the output voltage at an output terminal; and
a slew boost circuit configured to perform a slew boost operation of adjusting some currents among currents provided from the current summing stage to the input stage according to the difference between the input voltage and the output voltage by monitoring the difference between the input voltage and the output voltage and selectively perform the slew boost operation by monitoring the control voltages, wherein
based on determining that the difference between the input voltage and the output voltage is greater than or equal to a predetermined voltage, the slew boost circuit is configured to increase a sink current or a source current according to the difference between the input voltage and the output voltage,
the amplified currents include the sink current and the source current, and
the current summing stage includes (i) a first current mirror including PMOS transistors connected to a supply line of a first power source in a current mirror structure and (ii) a second current mirror including NMOS transistors connected to a supply line of a second power source in a current mirror structure.

2. The output buffer of claim 1, wherein:
the current summing stage includes a first current path connected to the input stage and a second current path connected to the input stage and the output stage and connected to the first current path in a current mirror structure; and
the slew boost circuit is connected to the first current path of the current summing stage through the input stage.

3. The output buffer of claim 2, wherein when the difference between the input voltage and the output voltage is greater than or equal to the predetermined voltage or more, the slew boost circuit is configured to adjust the sink current and the source current provided to the input stage from the first current path of the current summing stage, in order to adjust currents and the control voltages provided to the output stage from the second current path of the current summing stage.

4. The output buffer of claim 1, wherein the input stage includes:
a first input portion including p-channel metal-oxide semiconductor (PMOS) transistors each controlled by the input voltage and the output voltage;
a second input portion including n-channel metal-oxide semiconductor (NMOS) transistors each controlled by the input voltage and the output voltage;
a first bias circuit including a PMOS transistor controlled by a first bias voltage to provide a bias current to the first input portion; and
a second bias circuit including an NMOS transistor controlled by a second bias voltage to provide a bias current to the second input portion.

5. The output buffer of claim 4, wherein the current summing stage includes:
a first cascode circuit including PMOS transistors connected to the first current mirror in series and controlled by a third bias voltage;
a second cascode circuit including NMOS transistors connected to the second current mirror in series and controlled by a fourth bias voltage;
a third bias circuit including a PMOS transistor and an NMOS transistor connected to a first current path between the first cascode circuit and the second cascode circuit and respectively controlled by a fifth bias voltage and a sixth bias voltage; and
a fourth bias circuit including a PMOS transistor and an NMOS transistor connected to a second current path between the first cascode circuit and the second cascode circuit and respectively controlled by a seventh bias voltage and an eighth bias voltage.

6. The output buffer of claim 5, wherein the output stage includes:
a pull-up PMOS transistor controlled by the first control voltage generated in a first output node between the first cascode circuit and the fourth bias circuit and connected between the supply line of the first power source and the output terminal; and
a pull-down NMOS transistor controlled by the second control voltage generated in a second output node between the second castor circuit and the fourth bias circuit and connected between the output terminal and the supply line of the second power source.

7. The output buffer of claim 6, wherein the output stage further includes:
a capacitor portion including a first capacitor connected between the output terminal and a third output node between the first current mirror and the first cascode circuit; and
a second capacitor connected between the output terminal and a fourth output node between the second current mirror and the second cascode circuit.

8. The output buffer of claim 6, wherein the slew boost circuit further includes:
a first current control portion configured to control any one source current generated in the current summing stage according to the difference between the input voltage and the output voltage;
a first switching portion including a PMOS transistor controlled by the first control voltage and connected between the supply line of the first power source and the first current control portion;
a second current control portion configured to control any one sink current generated in the current summing stage according to the difference between the input voltage and the output voltage; and
a second switching portion including an NMOS transistor controlled by the second control voltage and connected between the second current control portion and the supply line of the second power source.

9. The output buffer of claim 8, wherein:
when the first control voltage is a gate-on voltage, the first switching portion is configured to provide a bias current to the first current control portion; and
when the first control voltage is a gate-off voltage, the first switching portion is configured to block a current flow of the first current control portion.

10. The output buffer of claim 8, wherein:
when the second control voltage is a gate-on voltage, the second switching portion is configured to provide a bias current to the second current control portion; and
when the second control voltage is a gate-off voltage, the second switching portion is configured to block a current flow of the second current control portion.

11. The output buffer of claim 8, wherein the first current control portion includes:
a third input portion including PMOS transistors each controlled by the input voltage and the output voltage;
a fifth bias circuit controlled by the first bias voltage and connected between the supply line of the first power source and the PMOS transistor of the first switching portion; and
an NMOS transistor connected between the PMOS transistor controlled by the input voltage in the third input portion and the supply line of the second power source in a diode structure,
wherein the PMOS transistor controlled by the output voltage in the third input portion is connected to the first current path of the current summing stage.

12. The output buffer of claim 8, wherein the second current control portion includes:
a fourth input portion including NMOS transistors each controlled by the input voltage and the output voltage;
a sixth bias circuit controlled by the second bias voltage and connected between the NMOS transistor of the second switching portion and the supply line of the second power source; and
a PMOS transistor connected between the supply line of the first power source and the NMOS transistor, which is controlled by the input voltage in the fourth input portion, in a diode structure,
wherein the NMOS transistor controlled by the output voltage in the fourth input portion is connected to the first current path of the current summing stage.

13. The output buffer of claim 11, wherein, in the slew boost circuit, when the difference between the input voltage and the output voltage is greater than or equal to a predetermined voltage and the first control voltage is a gate-on voltage, an output current of the PMOS transistor controlled by the output voltage in the third input portion is added to an output current of the PMOS transistor controlled by the output voltage in the first input portion to increase a source current flowing from the slew boost circuit and the input stage to the first current path of the current summing stage.

14. The output buffer of claim 12, wherein, in the slew boost circuit, when the difference between the input voltage and the output voltage is greater than or equal to a predetermined voltage and the second control voltage is a gate-on voltage, a drain current of the NMOS transistor controlled by the output voltage in the fourth input portion is added to a drain current of the NMOS transistor controlled by the output voltage in the second input portion to increase a sink current flowing from the first current path of the current summing stage to the input stage and the slew boost circuit.

15. The output buffer of claim 11, wherein:
when the first control voltage is a gate-on voltage, the PMOS transistor of the first switching portion is turned on to provide a bias current of the fifth bias circuit to the PMOS transistors of the first current control portion; and
when the first control voltage is a gate-off voltage, the PMOS transistor of the first switching portion is turned off to block a current flow of the first current control portion.

16. The output buffer of claim 12, wherein:
when the second control voltage is a gate-on voltage, the NMOS transistor of the second switching portion is turned on to provide a bias current of the sixth bias circuit to the NMOS transistors of the second current control portion; and
when the second control voltage is a gate-off voltage, the NMOS transistor of the second switching portion is turned off to block a current flow of the second current control portion.

17. The output buffer of claim 8, wherein:
when any one of the first control voltage and the second control voltage is a gate-on voltage, the slew boost circuit is configured to perform the slew boost operation; and
when both the first control voltage and the second control voltage are a gate-off voltage, the slew boost operation is turned off.

18. The output buffer of claim 1, wherein:
when the input voltage and the output voltage are different by a predetermined voltage or more and any one of the control voltages is a gate-on voltage, the slew boost circuit is configured to perform the slew boost operation; and
when the input voltage and the output voltage are equal and the control voltages are a gate-off voltage, the slew boost operation is turned off.

19. A data driver circuit comprising:
a digital-analog converter configured to convert input digital data into an analog data signal to output the analog data signal; and
an output buffer portion including the output buffer of claim 1 for each channel so as to buffer an input data signal provided from the digital-analog converter and output an output data signal to an output channel.

* * * * *